(12) United States Patent
Leigh et al.

(10) Patent No.: US 9,996,119 B2
(45) Date of Patent: Jun. 12, 2018

(54) MODULE CONNECTIVITY DEVICE

(71) Applicant: HEWLETT PACKARD ENTERPRISE DEVELOPMENT LP, Houston, TX (US)

(72) Inventors: Kevin B. Leigh, Houston, TX (US); George D. Megason, Spring, TX (US); Eugene E. Freeman, The Woodlands, TX (US); William James Walker, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days. days.

(21) Appl. No.: 14/897,965

(22) PCT Filed: Jul. 22, 2013

(86) PCT No.: PCT/US2013/051501
§ 371 (c)(1),
(2) Date: Dec. 11, 2015

(87) PCT Pub. No.: WO2015/012794
PCT Pub. Date: Jan. 29, 2015

(65) Prior Publication Data
US 2016/0124470 A1 May 5, 2016

(51) Int. Cl.
| | |
|---|---|
| *G06F 1/16* | (2006.01) |
| *H05K 5/00* | (2006.01) |
| *H05K 7/00* | (2006.01) |
| *G06F 1/18* | (2006.01) |
| *H05K 7/14* | (2006.01) |
| *H01H 23/12* | (2006.01) |
| *H01R 25/00* | (2006.01) |

(Continued)

(52) U.S. Cl.
CPC .............. *G06F 1/18* (2013.01); *G06F 1/183* (2013.01); *H01H 23/12* (2013.01);
(Continued)

(58) Field of Classification Search
CPC ......... G06F 1/18; G06F 1/183; H05K 7/1492; H05K 7/1491; H05K 7/1489;
(Continued)

(56) References Cited

U.S. PATENT DOCUMENTS 4,151,580 A * 4/1979 Struger ................ H05K 7/1469
361/755
4,699,455 A * 10/1987 Erbe .................... G02B 6/4202
385/88

(Continued)

FOREIGN PATENT DOCUMENTS

WO    WO-2009114002    9/2009

OTHER PUBLICATIONS

International Searching Authority, The International Search Report and the Written Opinion, dated Apr. 21, 2014, 10 Pages.

*Primary Examiner* — Anthony Haughton
(74) *Attorney, Agent, or Firm* — Hewlett Packard Enterprise Patent Department

(57) ABSTRACT

A module connectivity device includes a stationary pivot plenum, a number of rocker-arm assemblies movably coupled to the stationary pivot plenum in which the rocker-arm assemblies move between an open position and a closed position, and a number of module connectors movably coupled to the rocker-arm assemblies, in which the module connectors move between a disengaged position and an engaged position with respect to the connectors on system modules. A module connectivity system includes a number of rocker-arm assemblies and a number of module connectors movably coupled to the number of rocker-arm assemblies. The system also includes a module connectivity manager to manage the connectivity of the module connectors.

11 Claims, 9 Drawing Sheets

(52) U.S. Cl.
CPC ......... *H01R 25/006* (2013.01); *H05K 7/1492* (2013.01); *H01H 2231/002* (2013.01)

(58) Field of Classification Search
CPC .. H05K 7/1488; H05K 7/1487; H05K 7/1485; H01H 23/12; H01H 25/006
USPC ...... 361/679.58, 724–727; 312/223.1, 223.2, 312/223.3
See application file for complete search history.

(56) References Cited

U.S. PATENT DOCUMENTS

| | | | | |
|---|---|---|---|---|
| 5,673,175 A | * | 9/1997 | Carney | G06F 1/181 |
| | | | | 292/202 |
| 5,946,440 A | * | 8/1999 | Puetz | G02B 6/4452 |
| | | | | 385/135 |
| 6,138,839 A | * | 10/2000 | Cranston, III | G06F 1/184 |
| | | | | 211/41.17 |
| 6,885,551 B2 | | 4/2005 | Chen | |
| 6,916,190 B2 | | 7/2005 | Joist | |
| 7,023,708 B2 | | 4/2006 | Nguyen et al. | |
| 7,916,476 B2 | * | 3/2011 | Hsu | G06F 1/186 |
| | | | | 211/41.17 |
| 7,952,883 B2 | | 5/2011 | Hidaka | |
| 8,218,308 B2 | * | 7/2012 | Yang | G06F 1/185 |
| | | | | 361/679.32 |
| 9,715,075 B2 | * | 7/2017 | Solheid | G02B 6/4455 |
| 2003/0222034 A1 | | 12/2003 | Champion et al. | |
| 2006/0215373 A1 | | 9/2006 | Joist et al. | |
| 2009/0034227 A1 | | 2/2009 | Mayer | |
| 2012/0050981 A1 | | 3/2012 | Xu et al. | |
| 2012/0126069 A1 | | 5/2012 | Kucer et al. | |

\* cited by examiner

*Fig. 7A*
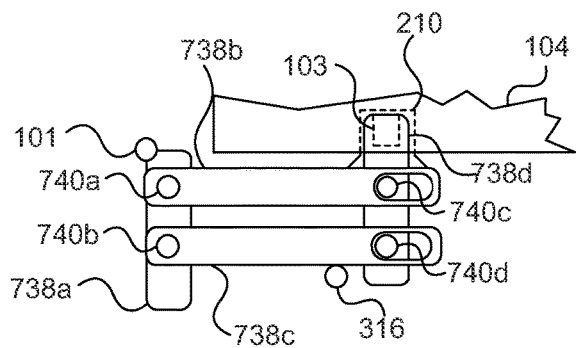
*Fig. 7B*
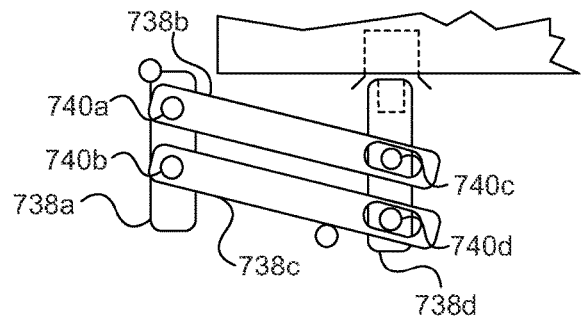
*Fig. 7C*
*Fig. 7D*
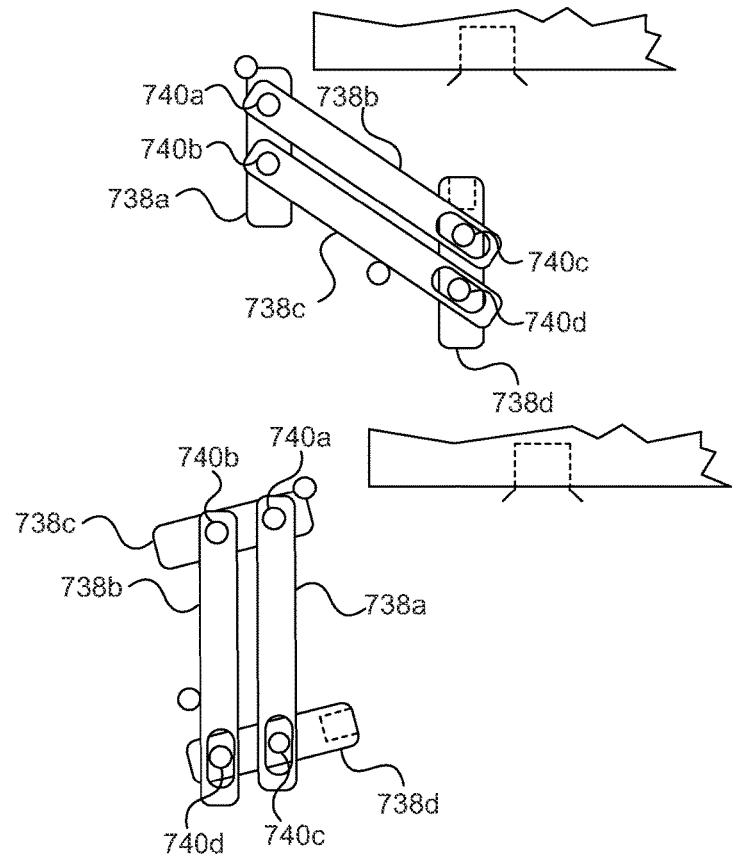

MODULE CONNECTIVITY DEVICE

BACKGROUND

Today's businesses are using increasingly complex computing infrastructures to complete their day-to-day tasks. Accordingly, businesses utilize data centers to manage these complex infrastructures. Data centers include rack cabinets, or racks, that store and connect the various electronic devices that make up a computing infrastructure. For example, a rack may include blade servers, storage systems, network systems, and switches that assist the business in carrying out complex electronic functions. As needs change, new electronic devices may be added, or existing electronic devices may be serviced.

BRIEF DESCRIPTION OF THE DRAWINGS

The accompanying drawings illustrate various examples of the principles described herein and are a part of the specification. The illustrated examples are given merely for illustration, and do not limit the scope of the claims.

FIG. 7A through 7D are top views of stages of connection of a module connectivity device, according to one example of the principles described herein.

Throughout the drawings, identical reference numbers designate similar, but not necessarily identical, elements.

DETAILED DESCRIPTION

Figure 1:
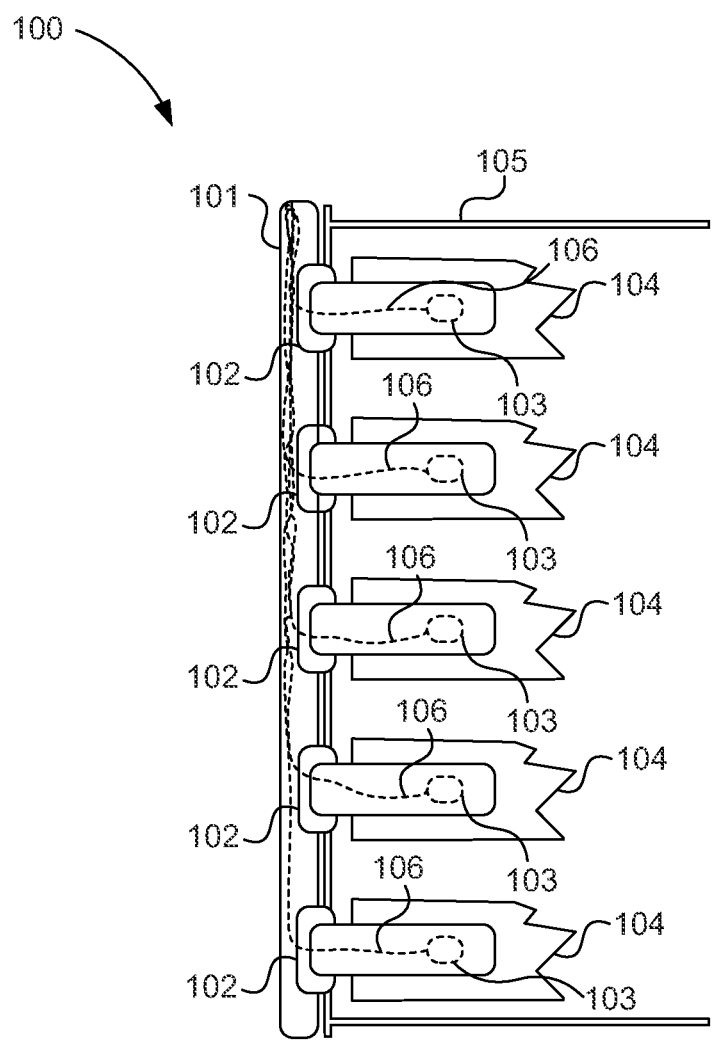
FIG. 1 is a front view of a module connectivity device, according to one example of the principles described herein.

Data centers use racks to store and control electronic devices including switches and blade servers. In a rack, multiple electronic devices can be stacked either vertically or horizontally. Racks facilitate the addition of new electronic devices and the service of existing electronic devices. As is common with electronic devices, the electronic devices in a rack utilize complex cable connectivity across systems to carry out the functionality of a rack-mount server or a blade enclosure. Simplifying the rack and electronic device infrastructure is beneficial as it enhances accessibility to the electronic devices and reduces the congestion within the rack.

However, current electronic device connectivity management may exhibit significant deficiencies. For example, often times interconnected devices of a rack-mount system may be installed or serviced on opposite sides of the rack. For example, a blade server may be installed and serviced via the front of the rack, while a switch that is connected to the blade server may be installed and serviced via the back of the rack.

Additionally, power and electrical transmission lines may be supplied to the electronic devices via a faceplate of the rack. The cabling infrastructure associated with the electronic devices is often complex and requires a skilled technician to install and remove the cables. Incorrect installation and removal of these cables is a common source of human error. Lastly, the complex cabling structure of the electronic devices is bulky and blocks air flow to the electronic devices, increasing the risk of an overheated system.

Thus, the present disclosure describes a module connectivity device. The module connectivity device comprises a stationary pivot plenum. The module connectivity device also comprises a number of rocker-arm assemblies movably coupled to the stationary pivot plenum. The rocker-arm assemblies move between an open position and a closed position. A number of module connectors are movably coupled to the rocker-arm assemblies. The module connectors move between a disengaged position and an engaged position. In some examples, via a single action, the module connector may be engaged to a connector of a module in the rack and the rocker-arm may be secured in the closed position. A rocker-arm assembly may also comprise a conduit that houses optical waveguides, optical fibers, optical connectors, electrical cables, electrical connectors, power supply devices, or a combination thereof. In some examples, a gang bar moves a number of rocker-arm assemblies simultaneously.

The present disclosure also describes a computer program product for managing a module connectivity device. The computer program product comprises a computer readable storage medium including computer usable program code that, when executed by a processor, detects a connectivity state of the module connectivity system. The connectivity state may be, for example, a "connected" state, a "disconnected" state, a "safe to disconnect" state, or a "repair needed" state. The computer usable program code provides feedback on the detected connectivity state of the module connectivity device. For example, a light emitting diode (LED) or an email alert may indicate the connectivity state.

As used in the present specification and in the appended claims, the term "module" is meant to be understood broadly as any electronic device that is stored in a rack. Examples of modules include blade servers, blade switches, network systems, and storage systems, among other electronic devices.

As used in the present specification and in the appended claims, the term "module connector" is meant to be understood broadly as any device that interfaces with a corresponding connector on a module of a rack. The module connector also supplies a resource to the module. For example, the module connector may supply electrical power and electrical transmission lines to the module. Other examples of resources supplied include, but are not limited to, optical waveguides and optical signals.

Further, as used in the present specification and in the appended claims, the term "retention mechanism" is meant to be understood broadly as any device that secures the rocker-arm assemblies or module connectors in a position. For example, a rocker-arm retention mechanism may secure the rocker-arm assemblies in a closed position. In another example, a retention mechanism may secure the module connectors to the module of the rack, or a gang bar. The retention mechanism may utilize magnets, mechanical means, electrical means, or a combination thereof, to secure the rocker-arm assemblies or module connectors in a position.

Even further, as used in the present specification and in the appended claims, the term "rack" or similar language is meant to be understood broadly as any structure that houses a number of modules. The rack serves as a gateway for electrical power, and transmission signals, among other resources. An example of a rack is given as follows. A server blade system uses multiple printed circuit boards in various orientations to contain and connect electronic components including processors, memory devices, input/output devices, and storage devices. These blades are used in blade enclosures that are mounted in racks. The racks are arranged in datacenter rooms.

Even still further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1 is a front view of a module connectivity device (100), according to one example of the principles described herein. The module connectivity device (100) includes a stationary pivot plenum (101), a number of rocker-arm assemblies (102), and a number of module connectors (103). For reference, FIG. 1 also depicts a number of modules (104) disposed in a rack (105). However, the rack (105) and the number of modules (104) are not described in detail herein. As depicted in FIG. 1, the modules (104) are horizontally oriented, stacked one on top of the other. However, in some examples, as will be described in connection with FIG. 4, the modules (104) may be vertically oriented, side-by-side. Examples of modules (104) include, but are not limited to, blade servers, storage systems, network systems, switches, and other electronic devices.

In some examples, the stationary pivot plenum (101) may be a vertical arm attached to the rack (105). The stationary pivot plenum (101) allows the rocker-arm assemblies (102) to rotate about the stationary pivot plenum (101). In some examples, the stationary pivot plenum (101) may be coupled to the rack (105).

The module connectivity device (100) also includes a number of rocker-arm assemblies (102) that are movably coupled to the stationary pivot plenum (101). More specifically, the rocker-arm assemblies (102) may rotate about the longitudinal axis of the stationary pivot plenum (101). The rocker-arm assemblies (102) may comprise a number of interconnected arms to move the module connectors (103). For example, in FIG. 1, the rocker-arm assembly (102) comprises one arm. However, as will be described in connection with FIG. 7, a rocker-arm assembly (102) may comprise multiple interconnected arms.

The rocker-arm assemblies (102) may move between an open position and a closed position. The open position corresponds to a disengaged position of the module connectors (103) and the closed position corresponds to an engaged position of the module connectors (103). The rocker-arm assemblies (102) may be in the open position to install a new module (104) or to service an existing module (104) and the rocker-arm assemblies (102) may be in a closed position to engage the modules (104). More detail concerning the movement of the rocker-arm assemblies (102) is given in connection with FIG. 2. While FIG. 1 depicts five rocker-arm assemblies (102), any number of rocker-arm assemblies (102) may be movably coupled to the stationary pivot plenum (101).

In some examples, the rocker-arm assemblies (102) may comprise a conduit that houses a cable (106) that supplies a resource to the modules (104). For example, the conduit of the rocker-arm assemblies (102) may house optical waveguides, optical fibers, electric data transmission cables, power cables or a combination thereof, that supply resources to the modules (104). The rocker-arm assemblies (102) may also house cables (106) that supply power to the modules (104). Accordingly, the rocker-arm assemblies (102) may house supplemental resource components. For example, the rocker-arm assemblies (102) may include, signal repeaters, amplifiers, e/o engines, signal converters, and other electrical components. Utilizing a conduit to house the cables (106) is beneficial in that it provides a protective environment for unprotected and small cables to be hidden, which enables greater, and cheaper, connectivity in a small volume space. The conduit also reduces the amount of loose-wires in the rack that are bulky, expensive, and error prone.

The rocker-arm assemblies (102) also provide a cable management service. For example, as the rocker-arm assemblies (102) are moved, cables (106) that are housed in the rocker-arm assemblies (102) may be prone to kinking, over-extension, and other conditions that inhibit resource transmission. Accordingly, the rocker-arm assemblies (102) may include wheels or conduits, among other elements to protect and manage the cables (106).

In some examples, the rocker-arm assemblies (102) may comprise identification tags (e.g., radio frequency identification (RFID) tags (not shown). The identification tags may be used in conjunction with a tag reader (not shown) on the module (104). Via the identification tags and the tag reader, a module (104) may identify what connectivity resources the module (104) is receiving via the rocker-arm assemblies (102). In another example, the rocker-arm assembly (102) may comprise the tag reader (not shown) and the module (104) may comprise an identification tag (not shown). In this example, a system manager may detect what modules (104) are connected to the rocker-arm assemblies (102).

Each rocker-arm assembly (102) may comprise a number of module connectors (103). The module connectors (103) interface with corresponding connectors on the modules (104) and supply a resource to the module (104). Specifically, the module connectors (103) may provide data signals, electrical power, or a combination thereof, to the modules (104). While FIG. 1 depicts one module connector (103) per rocker-arm assembly (102), a rocker-arm assembly (102) may comprise any number of module connectors (103).

Via the module connectors (103), a resource may be supplied to the modules (104). For example, a module connector (103) may be an optical interface that provides an optical signal to the module (104). Examples of optical interfaces include a hollow metallic channel coated with an optically transmissive material. Other examples of devices that propagate an optical signal include, but are not limited to, optical glass fibers, optical plastic fibers and polymer waveguides, among other optical signal propagation devices. In some examples, the rocker-arm assembly (102)

may also include other devices that modify an optical signal. Examples of devices that modify an optical signal include, but are not limited to, a wavelength multiplexer, a wavelength demultiplexer, a bus, a switch, a sputter, a combiner, a transponder, and an amplifier, among other optical signal modification devices.

The module connectors (103) may be movably coupled to the rocker-arm assemblies (102). For example, as will be described in detail below, the module connectors (103) may move laterally with respect to the rocker-arm assemblies (102). Accordingly, the rotational motion of the rocker-arm assemblies (102) with respect to the stationary pivot plenum (101) in conjunction with the lateral motion of the module connectors (103) with respect to the rocker-arm assemblies (102) may result in a module connector (103) that moves rotationally and laterally with respect to the stationary pivot plenum (101).

The module connectors (103) may move between an engaged position and a disengaged position. An engaged position may be defined as a position in which a module connector (103) interfaces with, and provides a resource to a module (104) of the rack (105). By comparison, a disengaged position may be defined as a position in which the module connector (103) is free, or disengaged, from the module (104) of the rack (105). As described above, the engaged position of the module connector (103) corresponds to an open position of a rocker-arm assembly (102) and the disengaged position of the module connector (103) corresponds to a closed position of a rocker-arm assembly (102).

Implementing the module connectivity device (100) as described herein may be beneficial in that it allows modules (104) (servers, switches, among other modules) to be installed and serviced on the same side of a rack (105) as the cables, without having to install/remove a complex cable infrastructure within the stationary pivot plenum (101). Moreover, implementing a module connector (103) and a conduit, to protect cables, eliminates bulky, dangling cables, thus reducing cable exposure, decreasing the likelihood of human error, and freeing up valuable rack (105) space.

FIGS. 2A through 2E are top views of stages of the connection of a module connectivity device (100), according to one example of the principles described herein. As described above, the module connectivity device (100) includes a rocker-arm assembly (102) rotationally coupled to a stationary pivot plenum (101). As depicted in FIGS. 2A through 2E, the stationary pivot plenum (101) is a vertical arm. In FIG. 2, for simplicity, a single instance of a number of elements previously described is indicated by a single reference numeral.

The rocker-arm assembly (102) may include a rocker-arm retention mechanism (208) that secures the rocker-arm assembly (102) in an open position, a closed position, or a combination thereof. For example, as depicted in the fifth stage of FIG. 2E, the rocker-arm retention mechanism (208) secures the rocker-arm assembly (102) in a closed position. The rocker-arm retention mechanism (208) may comprise any device that secures the rocker-arm assembly (102) in the closed position. For example, as depicted in FIGS. 2A through 2E, the rocker-arm retention mechanism (208) may include a latch, or protrusion extending from a retention arm (211) that is movably coupled to the rocker-arm assembly (102). The latch interfaces with a catch (212) disposed on the module (104) to secure the rocker-arm assembly (102) in the closed position. Examples of devices that secure the rocker-arm assembly (102) include mechanical latches as depicted in FIGS. 2A through 2E, but may also include magnets, mechanical clips, and springs, among other mechanical retention mechanisms.

The rocker-arm assembly (104) may also include a connection mechanism (209) that mates the module connector (103) to a corresponding connector (210) of the module (104). The connector (210) may be any device that receives a module connector (103). For example, the connector (210) may comprise a receptacle defined in the module (104) that receives an optical interface such as a plastic optical fiber. As depicted in FIG. 2, the connection mechanism (209) may include a peg protruding from a surface of the module connector (103) that is inserted through a slot in the retention arm (211) of the rocker-arm assembly (102). In some examples, the rocker-arm retention mechanism (208) and the connection mechanism (209) may be implemented using a single action. More detail concerning the actuation of the connection mechanism (208) and the rocker-arm retention mechanism (209) is given below connection with the fourth stage of FIG. 2D.

A specific example of a connection of a module connectivity device (100) is given as follows. In a first stage depicted in FIG. 2A, the rocker-arm assembly (102) is in the open position. In this stage, a new module (104) may be installed. In another example, while the rocker-arm assembly (102) is in the open position, an existing module (104) may be serviced. In some examples, a rocker-arm assembly (102) may be in the open position while a number of other rocker-arm assemblies (102) are in the closed position, as will be described in connection with FIG. 4.

Figure 2A:
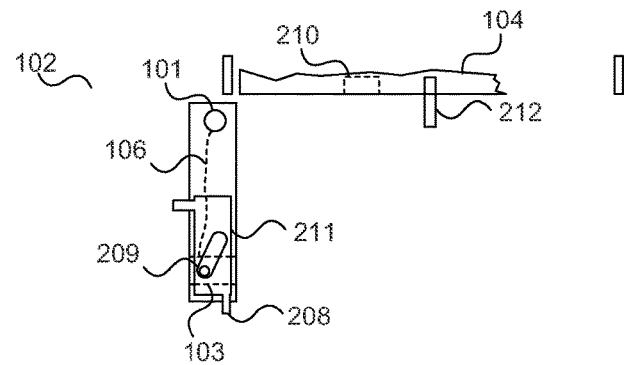
FIGS. 2A through 2E are top views of stages of connection of a module connectivity device, according to one example of the principles described herein.
Figure 2B:
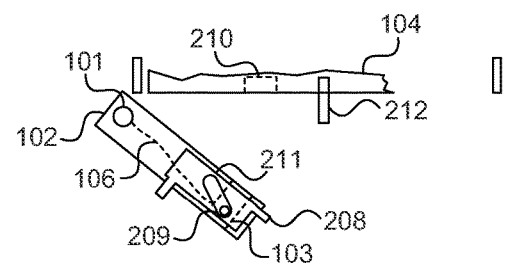
Figure 2C:
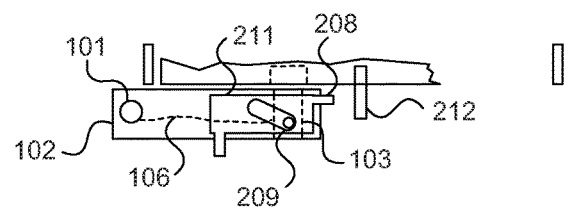

In a second stage as depicted in FIG. 2B, the rocker-arm assembly (102) is in transition from the open position to the closed position. For example, the rocker-arm assembly (102) is rotated about a longitudinal axis of a stationary pivot plenum (101). As the rocker-arm assembly (102) is rotated, the cable(s) (106) housed in the conduit are also rotated. As described above, in some examples, the rocker-arm assembly (102) may comprise a number of cable management devices that ensure the cable(s) (106) do not kink or overextend. In a third stage depicted in FIG. 2O, the rocker-arm assembly (102) is in the closed position. In the third stage depicted in FIG. 2O, the module connector (103) is not yet engaged with the connector (210).

Figure 2D:
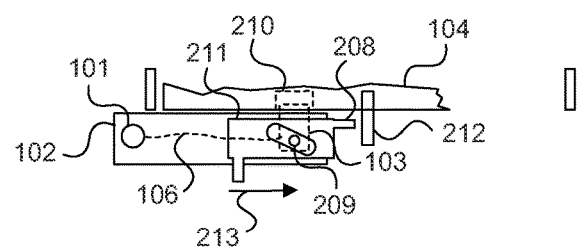

In a fourth stage depicted in FIG. 2D, the rocker-arm retention mechanism (208) (i.e., the latch) is actuated to secure the rocker-arm assembly (102) in the closed position. For example, a user may slide the retention arm (211) such that the latch engages with the catch (212) on the module (104). In this manner, the rocker-arm assembly (102) is mechanically coupled to the module (104) of the rack (105). While FIGS. 2A through 2E depict a latch-and-catch retention mechanism, any other mechanical mechanism for securing the rocker-arm assembly (102) may be implemented, such as a magnet, mechanical cup, spring, or other mechanical retention mechanism. Additionally, in the fourth stage depicted in FIG. 2D, the connection mechanism (209) is actuated to mate the module connector (103) with the connector (210). In this fashion, the rocker-arm assembly (102) is optically or electrically coupled to the module (104), and can supply a resource from the rack (105) via the cable(s) (106).

In some examples, the rocker-arm retention mechanism (208) and the connection mechanism (209) may be actuated by a single action. For example, a user may push on the retention arm (211) as indicated by the horizontal arrow (213). Doing so causes the peg to slide along a slot in the retention arm (211), causing the module connector (103) to move in an orthogonal direction to be mated to a connector (210) in the module (104). The same motion, indicated by the arrow (213) may also move the latch in a parallel direction to interface with the catch (212).

Figure 2E:
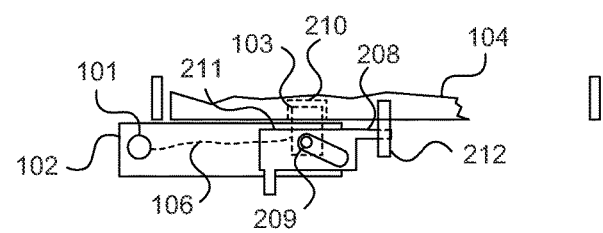

In a fifth stage depicted in FIG. 2E, the rocker-arm retention mechanism (208) has secured the rocker-arm assembly (102) in the closed position and the connection mechanism (209) has secured the module connector (103) in an engaged position with the connector (210). As described, the stages depicted in FIGS. 2A through 2E may be performed to engage the module connector (103) and retain the rocker-arm assembly (102) in a closed position. The stages may be performed in the reverse sequence to disengage the module connector (103) and to move the rocker-arm assembly (102) to the open position.

Figure 3:
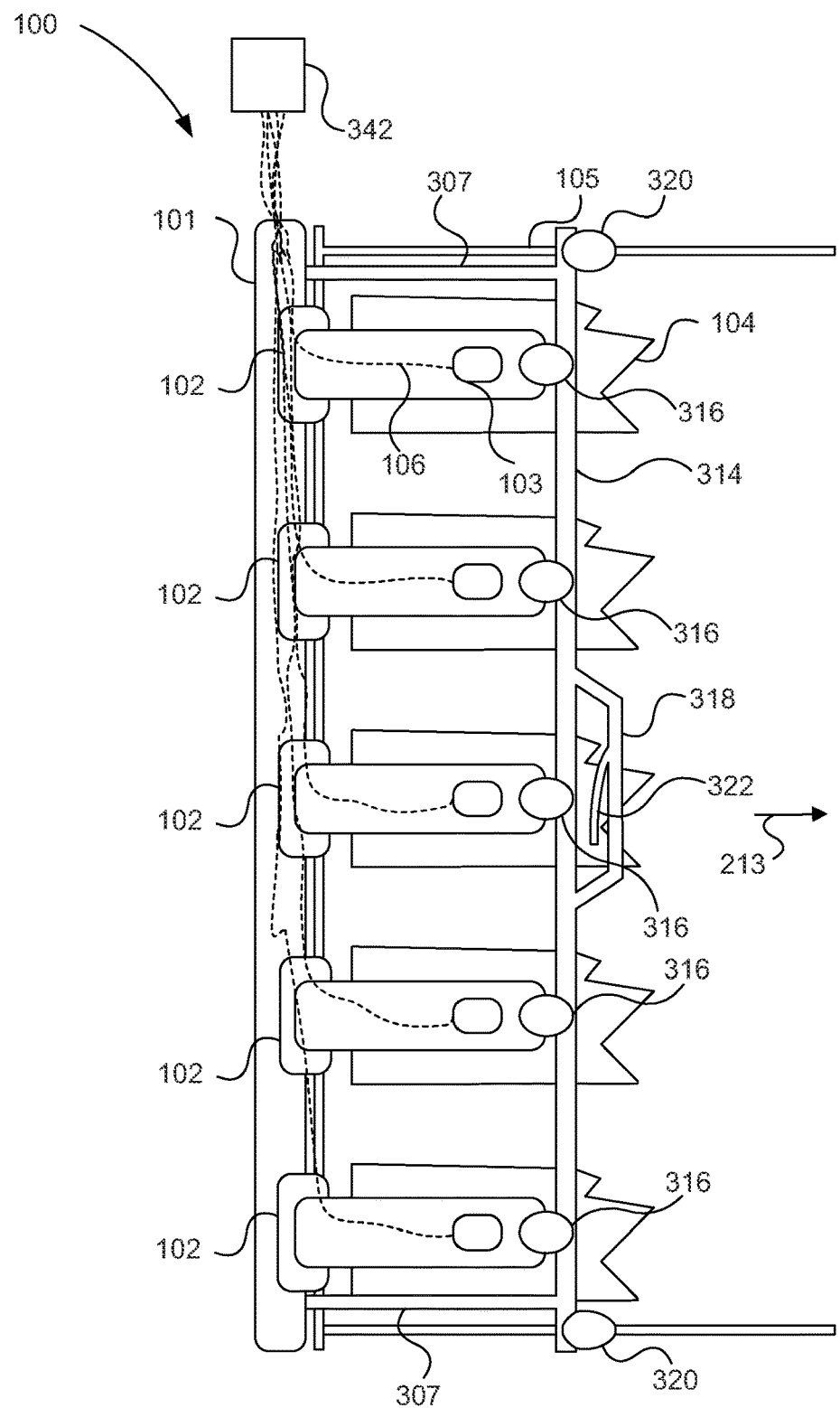
FIG. 3 is a front view of a module connectivity device, according to one example of the principles described herein.

FIG. 3 is a front view of a module connectivity device (100), according to one example of the principles described herein. As described above, the module connectivity device (100) may include a stationary pivot plenum (101) (i.e., a vertical arm), and a number of rocker-arm assemblies (102). The rocker-arm assemblies (102) may include a number of module connectors (103) and conduits that house cables (106). In FIG. 3, for simplicity, a single instance of a number of elements previously described is indicated by a single reference numeral.

In some examples, the module connectivity device (100) comprises a gang bar (314) to move a number of rocker-arm assemblies (102) simultaneously. The rocker-arm assemblies (102) may be removably coupled to the gang bar (314). In other words, the rocker-arm assemblies (102) that are coupled to the gang bar (314) may be operated independently from the other rocker-arm assemblies (102) coupled to the gang bar (314). For example, each rocker-arm assembly (102) may include a rocker/gang retention mechanism (316) that removably couples a rocker-arm assembly (102) from the gang bar (314). The rocker/gang retention mechanism (316) may be a mechanical device that secures the rocker-arm assembly (102) to the gang bar (314). Examples of rocker-arm retention mechanisms (316) include mechanical latches, mechanical clips, magnets, springs, or other mechanical retention mechanisms.

While FIG. 3 depicts all rocker-arm assemblies (102) removably coupled to the gang bar (314) any number of rocker-arm assemblies (102) may be removably coupled to the gang bar (314). For example, a number of rocker-arm assemblies (102) less than the number of total rocker-arm assemblies (102) may be coupled to the gang bar (314).

Via the gang bar (314), a number of rocker-arm assemblies (102) may be moved from the closed position to the open position simultaneously. For example, a user may grasp the gang bar handle (318) and rotate the gang bar (314) about a number of gang bar arms (307), and the coupled rocker-arm assemblies (102), about a longitudinal axis of the stationary pivot plenum (101).

Additionally, via the gang bar (314) a number of module connectors (103) may be moved from a disengaged position to the engaged position. For example, after aligning the module connectors (103) with the connector (FIG. 2, 210) of the module (104), as depicted in the third stage (FIG. 2C), the gang bar (314) may be moved as described in the fourth stage (FIG. 2D). In other words, the gang bar (314) may be moved in a direction indicated by the horizontal arrow (213) to retain and mate the module connectors (103) to the connectors (FIG. 2, 210) on the module (104).

In some examples, the gang bar (314) may be removably coupled to the rack (105) via a number of gang/rack retention mechanisms (320). The gang/rack retention mechanisms (320) may be mechanical devices that secure the gang bar (314) to the rack (105). Examples of gang/rack retention mechanisms (320) include mechanical latches, mechanical clips, magnets, or other mechanical retention mechanisms. A release lever (322) may disengage the gang bar (314), and the corresponding rocker-arm assemblies (102), from the rack (105). When actuated, the release lever (322) releases the gang/rack retention mechanisms (320), and the gang bar (314) and a number of rocker-arm assemblies (102) attached to the gang bar (314) may be swung open to expose the modules (104). In some examples, a number of rocker/gang retention mechanisms (316) may be disengaged from the corresponding rocker-arm assemblies (102). Accordingly, these rocker-arm assemblies (102) and their module connectors (103) may remain engaged to the corresponding connectors (210) when the gang bar (314) is swung open, carrying a number of other rocker-arm assemblies (102) attached to the gang bar (314).

In some examples, the rocker-arm assembly (102) may be coupled to a system manager (342) that manages the connectivity of the module connectivity device (100), among other tasks. For example, the system manager (342) may detect whether a module (104) is engaged. Feedback is then provided regarding the connectivity state. For example, in some examples, a connectivity status indicator (not shown) may indicate whether a module connector (103) is connected. For example, a light emitting diode (LED) disposed on the rocker-arm assembly (102) may indicate that the module connector (103) is engaged to the connector (210) in the module (104). In this example, the LED (not shown) may illuminate a color. The LED may also indicate that a module connector (103) is disengaged from the connector (210) in the module (104) or that there is a problem with the connection. In this example, the LED may flash a particular color. The connectivity status indicator may also indicate when it is safe to disengage the module connector (103) from the gang bar and/or connector (210).

In some examples, the system manager (342) may be notified when a request button (not shown) on the rocker-arm assembly (102) is depressed by a user to request the disconnection of the rocker-arm assembly (102). The system manager (342) may illuminate the status indicator LED with a color to either allow or disallow the user to disconnect the rocker-arm assembly (102).

As described above, in some examples, the rocker-arm assembly (102) may comprise a identification tag reader that indicates which modules (104) are connected to the rocker-arm assembly (102). In this example, the system manager (342) may receive the identification tag information from the tag reader and indicate what modules (104) are connected to the rocker arm assemblies (102) of the module connectivity device (FIG. 1, 100).

Figure 4:
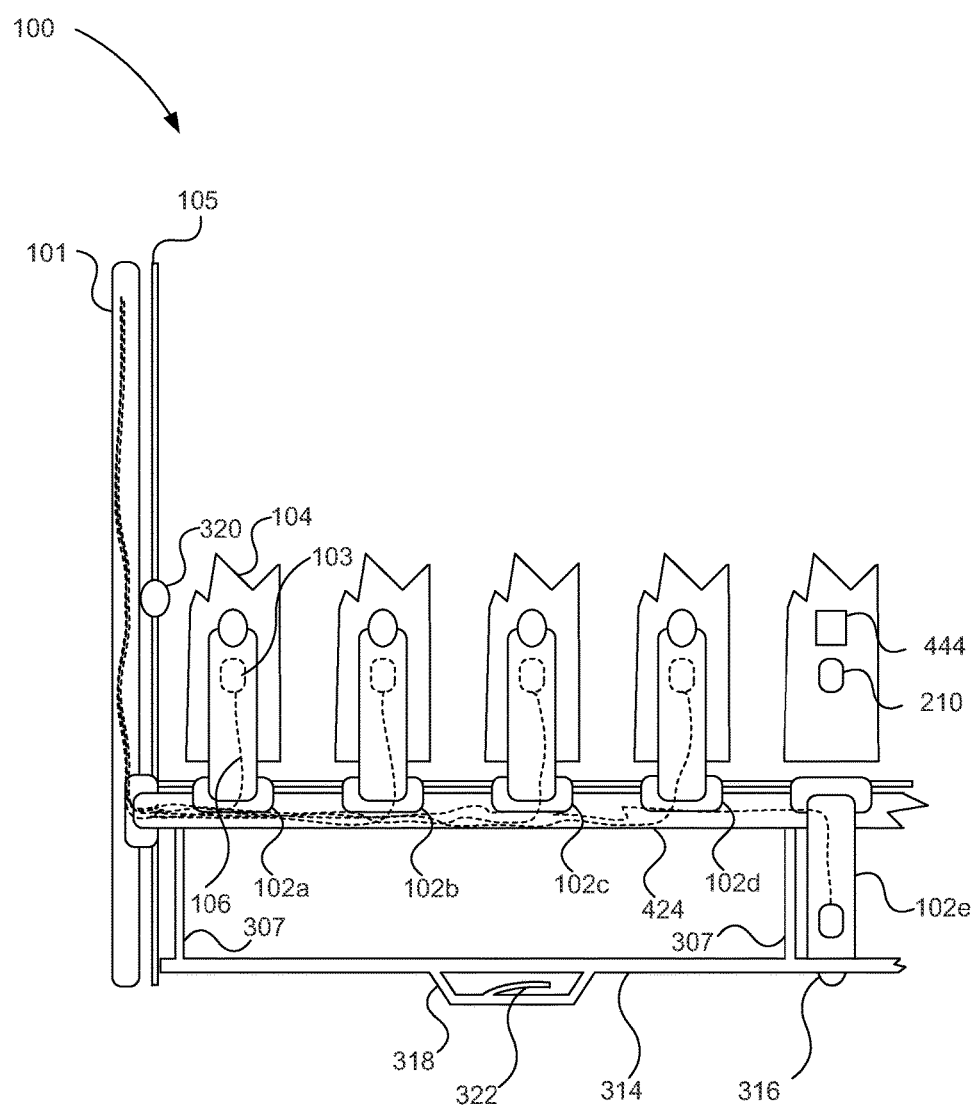
FIG. 4 is a front view of a module connectivity device, according to one example of the principles described herein.

FIG. 4 is a front view of a module connectivity device (100), according to one example of the principles described herein. As described above, the module connectivity device (100) may include a stationary pivot plenum (101), and a number of rocker-arm assemblies (102). The rocker-arm assemblies may include a number of module connectors (103) and conduits that house the cables (106). In FIG. 4, for simplicity, a single instance of a number of elements previously described is indicated by a single reference numeral.

As depicted in FIG. 4, modules (104) of the rack (105) may be vertically-oriented, positioned side-by-side. Accordingly, in order to connect to the modules (104), the rocker arm assemblies (102) may also be vertically oriented. In this example, the rocker-arm assemblies (102) may be attached to an interconnected arm (424). The interconnected arm (424) allows the rocker-arm assemblies (102) to rotate about a lateral axis of the interconnected arm (424). For example, a gang bar (314) and a rocker-arm assembly (102e) may disengage from a module (104) and rotate about the interconnected arm (424) to expose the underlying module (104) and connector (210). As described above, the rocker-arm assemblies (102) may independently disengage from the gang bar (314). For example, while one rocker-arm assembly (102e) is disengaged, other rocker-arm assemblies (102a-d) may be engaged to the gang bar (314). In other words, the rocker/gang retention mechanisms (316) corresponding to other rocker-arm assemblies (102a-d) may be disengaged from the gang bar (314). As depicted in FIG. 4, when a rocker-arm assembly (102e) is disengaged, a corresponding catch (444) on the module (104) may be exposed. The catch (444) and the rocker/gang retention mechanisms (316) may interface to secure the rocker-arm assemblies (102) to the module (104).

The interconnected arm (424) may be movably coupled at one end to the stationary pivot plenum (101). The stationary pivot plenum (101) allows the interconnected arm (424) to rotate about a longitudinal axis of the stationary pivot plenum (101). Accordingly, in this example, a number of rocker-arm assemblies (102) may be disengaged from the modules (104) via the gang bar (314). The rocker-arm assemblies (102) may be moved away farther from the rack (105) by rotating the interconnected arm (424) about the longitudinal axis of the stationary pivot plenum (101).

Figure 5:
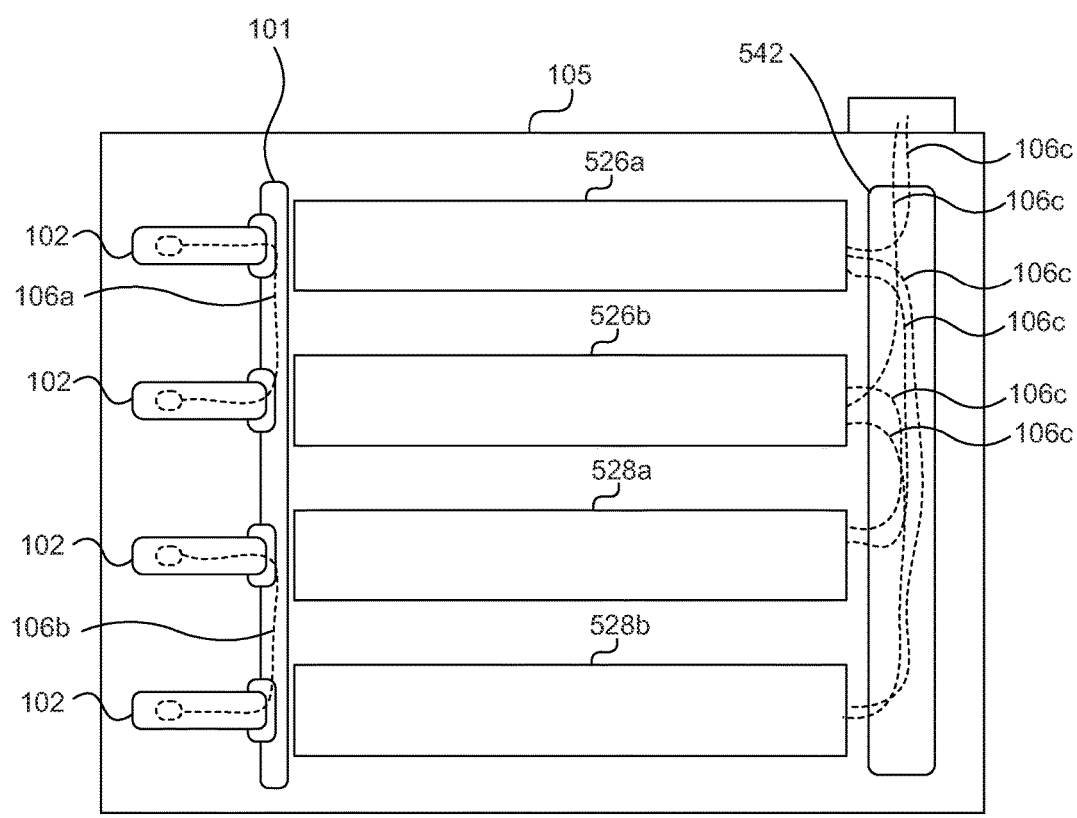
FIG. 5 is a side view of a rack implementing a module connectivity device, according to one example of the principles described herein.

FIG. 5 is a side view of a rack (105) implementing a module connectivity device (FIG. 1, 100), according to one example of the principles described herein. More specifically, FIG. 5 depicts a system comprising two blade servers (528a, 528b) and two switch blades (526a, 526b) stacked vertically. As described above, the module connectivity device (FIG. 1, 100) includes a stationary pivot plenum (101) and a number of rocker-arm assemblies (102) movably coupled to the stationary pivot plenum (101).

A module connectivity device (FIG. 1, 100) may be implemented on a front plane of the rack (105) to interconnect the two blade servers (528a, 528b) and to interconnect the two switch blades (526a, 526b). For example, a first set of electrical or optical cables (106a) may be disposed in conduits of a number of rocker-arm assemblies (102) to interconnect the switch blades (526a, 526b). Similarly, a second set of electrical or optical cables (106b) may be disposed in conduits of a number of other rocker-arm assemblies (102) to interconnect the blade servers (528a, 528b). At the back plane (542) of the rack (105) cables (106c) may be used to interconnect all the blades and switches together. Details on how the blade servers (528a, 528b) and switch blades (526a, 526b) are removably coupled to the backplane (542) are beyond the scope of the present disclosure.

While FIG. 5 depicts rocker-arm assemblies (102) at the front of the rack (105), the rocker-arm assemblies (102) may also be fixed to a side of the rack (105), or the back of the rack (105). Additionally, as described above, the module connectivity device (FIG. 1, 100) may span a portion of the rack (105), accordingly, a subset of the rocker-arm assemblies (102) may be movably coupled to the stationary pivot plenum (101). Any number of module connectivity devices (FIG. 1, 100) may be used with any number of rocker-arm assemblies (102) to service any grouping of modules (104), server blades (528a, 528b), blade switches (526a, 526b), or combinations thereof.

Figure 6:
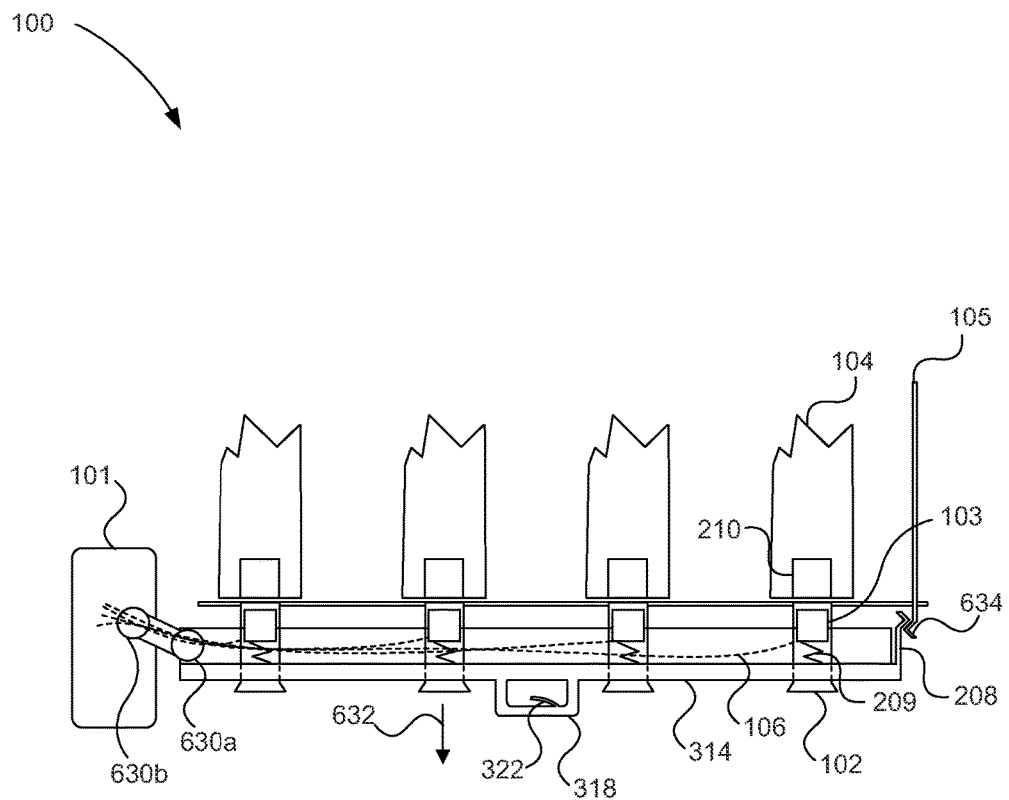
FIG. 6 is a top view of a module connectivity device, according to one example of principles described herein.

FIG. 6 is a top view of a module connectivity device (100), according to one example of principles described herein. As described above, in some examples, the modules (104) of a rack (105) may be vertically aligned, and accordingly, the rocker-arm assembly (102) may also be vertically aligned. In FIG. 6, for simplicity, a single instance of a number of elements previously described is indicated by a reference numeral.

FIG. 6 also depicts another example of a gang/module retention mechanism (208). In this example, the gang/module retention mechanism (208) may comprise a clip disposed on one end of the gang bar (314). When the rocker-arm assemblies (102) are in the closed position, the clip may interact with a corresponding rack clip (634). In this fashion, gang bar (314) and the rocker-arm assemblies (102) may be secured against the rack (105). The gang bar (314) may be disengaged from the rack (105) by separating the clips and pulling on the gang bar handle (318). In another example, the release lever (322) in the gang bar handle (318) may be actuated to release the gang bar (314) from the rack clip (634).

FIG. 6 also depicts another example of a connection mechanism (209). As depicted in FIG. 6, the connection mechanism (209) may comprise a spring disposed between the module connector (103) and the gang bar (314). As the module connector (103) is aligned with the connector (210) of the module, a spring force may position and mate the module connector (103) to the connector (210). To independently disengage a single rocker-arm assembly (102) from the module (210), a user may pull on the rocker-arm as indicated by the vertical arrow (632). Accordingly, the rocker-arm (102) may be disengaged, while the remaining rocker-arm assemblies (102) remain engaged to the modules (104). In another example, a user may push on the rocker-arm assembly (102) to disengage a spring-loaded locking mechanism (not shown) inside the rocker-arm assembly (102).

While FIG. 6 depicts the rocker-arm assemblies (102) as being perpendicular to the surface of the modules (104), different mating angles may be utilized. For example, the rocker-arm assemblies (102) may be angled with respect to the module (104) surface. Using angle-mating rocker-arm assemblies (102) in this fashion may be beneficial as it does not subject the cables (106) to a sharp bend, which could kink the cable and interfere with signal, or power transmission. Rather, a gentler angle may be used to ensure data and power transmission.

In some examples, the rocker-arm assembly (102) may comprise a number of intermediate pivot points (630) that increase the mobility of the rocker-arm assembly (102). For example, as a user pulls on the gang bar (314) to disengage the rocker-arm assemblies (102), the gang bar may pivot about a first pivot point (630a) and a second pivot point (630b) to translate the rocker-arm assemblies (102) away from the rack (105) and to further rotate the rocker-arm assemblies (102) away from the rack (105).

FIGS. 7A through 7D are top views of stages of connection of a module connectivity device (FIG. 1, 100), according to one example of the principles described herein. As described above, in some examples, a rocker-arm assembly (FIG. 1, 102) may include multiple interconnected arms (738). For example, as depicted in FIGS. 7A through 7D, a rocker arm assembly (FIG. 1, 102) may include a connector arm (738a), a number of forearms (738b, 738c) and a module connector carrier (738d) to move the module connector (103) with respect to the module (104). In FIGS. 7A through 7D, for simplicity, a single instance of a number of elements previously described is indicated by a single reference numeral.

A specific example of disconnecting module connectivity device is given as follows. In a first stage depicted in FIG. 7A, the rocker-arm assembly (FIG. 1, 102) is in a closed position. In other words, the forearms (738b, 738c) keep the module connector (103) engaged with a connector (210) on the module (104).

In a second stage depicted in FIG. 7B, the rocker-arm assembly (FIG. 1, 102) is transitioning out of the closed position. In this stage, the forearms (738b, 738c) are rotating about a number of pivot points (740) to move the module connector carrier (738d) and the module connector (103) away from the module (104). More specifically, the forearms (738b, 738c) rotate about pivot points (740a, 740b) coupled to the connector arm (738c) to rotate away from the module. At the same time, the module connector carrier (738d) and the pivot points (740c, 740d) slide along elongated holes while the walls of the connector (210) guide the module connector carrier (738d) laterally away from the module (104). In some examples, other mechanical guide features, such as alignment pins and sockets, may be used instead of, or addition to, the connector (210) walls.

In a third stage depicted in FIG. 70, the forearms (738b, 738c) continue to rotate about the pivot points (740a, 740b) coupled to the connector arm (738a), moving the module connector carrier (738d) away from the module (104). However, in the third stage depicted in FIG. 70, without the connector (210) walls to guide the module connector carrier (738d), the pivot points (740c, 740d) may not slide in the elongated holes. Accordingly, the module connector carrier (738d) may not translate vertically and may rotate along with the forearms (738b, 738c).

In a fourth stage depicted in FIG. 7D, the forearms (738b, 738c) continue to rotate about the pivot points (740a, 740b) coupled to the connector arm (738a), moving the module connector carrier (738d) away from the module (104). Additionally, the connector arm (738c) may rotate about the stationary pivot plenum (101) to further move the module connector carrier (738d) away from the module (104). For example, the connector arm (738a) may rotate about a longitudinal axis of a stationary pivot plenum (101). In this fourth stage depicted in FIG. 7D a new module (104) may be installed. In another example, while the rocker-arm assembly (FIG. 1, 102) is in the open position, an existing module (104) may be serviced. In some examples, a rocker-arm assembly (102) may be in the open position while a number of other rocker-arm assemblies (102) are in the closed position, as described in connection with FIG. 4. A gang bar (FIG. 3, 314) may be attached to the rocker-arm retention mechanisms (316) for a number of the rocker-arm assemblies (102) as described above.

Figure 8:
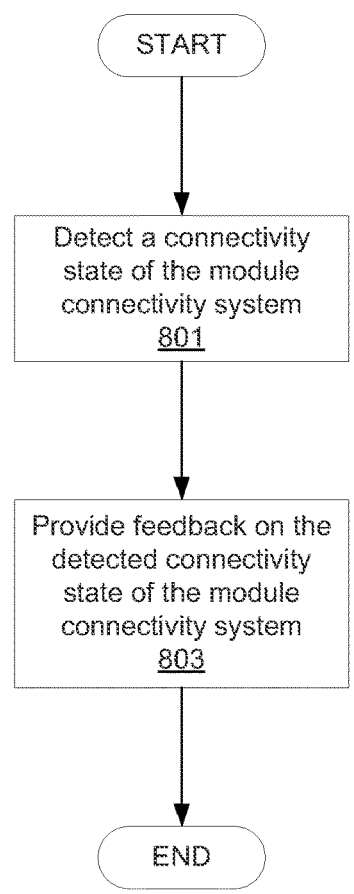
FIG. 8 is a flowchart showing a method for managing module connectivity, according to one example of principles described herein.

FIG. 8 is a flowchart showing a method (800) for managing module connectivity, according to one example of principles described herein. The method (800) may be performed by a system manager (342). The method (800) may begin by detecting (801) a connectivity state of the module connectivity system. For example, a module connectivity device (FIG. 1, 102) may include a number of sensors that indicate whether the module connectors (FIG. 1, 103) are engaged with the module (FIG. 1, 104). Another example of a connectivity state may be a "disconnected" state when the module connectors (FIG. 1, 103) are disengaged from the module (FIG. 1, 104). Yet another example of a connectivity state is an "error" state in which a problem exists with a connection. For example, a cable, a module connector (FIG. 1, 103) or a connector (FIG. 2, 210) may be physically damaged or otherwise malfunctioning.

In yet another example, the system manager (342) may detect when it is safe to remove a module connector (FIG. 1, 103). Detecting when it is safe to remove a module connector (FIG. 1, 103) may be based on a remove request. For example, a user may depress a request button to request the disconnection of the rocker-arm assembly (102).

The method (800) may then include providing (803) feedback on the detected connectivity state. For example, as described above, an LED indicator disposed on a rocker-arm assembly (FIG. 1, 102), the gang bar (FIG. 3, 314), or any combination thereof, may indicate via a color indication, the connectivity state. For example, an LED may illuminate, or flash, a certain color to indicate a connected state. Similarly, the LED may illuminate or flash other colors to indicate other statuses.

Figure 9:
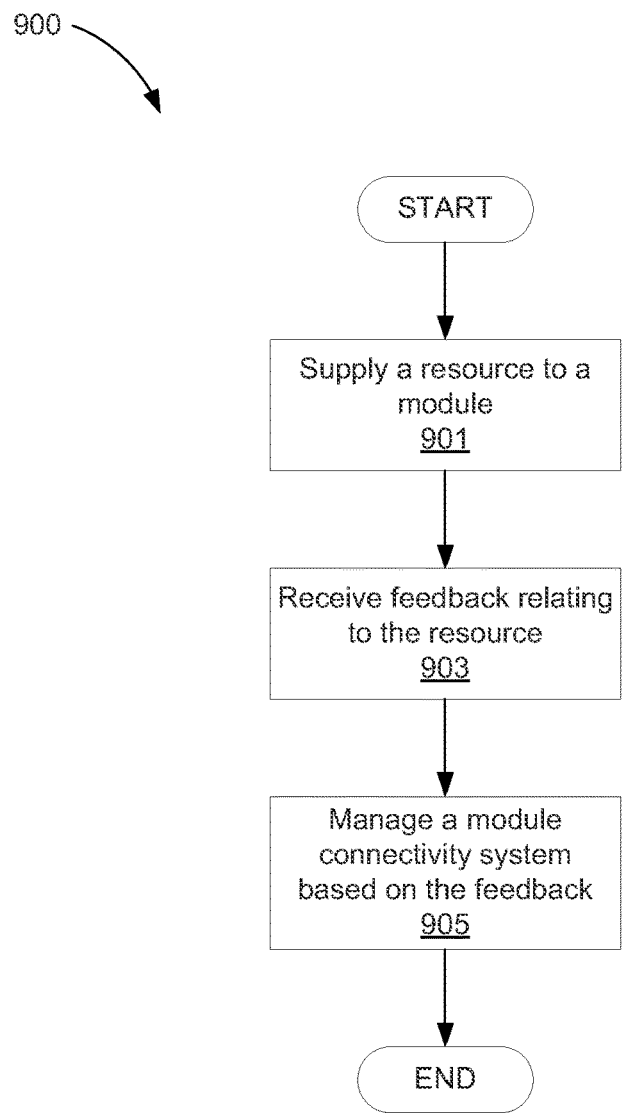
FIG. 9 is a flowchart showing a method for managing a resource, according to one example of principles described herein.

FIG. 9 is a flowchart showing a method (900) for managing a resource, according to one example of principles described herein. As described above, via the rocker-arm assemblies (FIG. 1, 102), the system manager (FIG. 3, 342) may provide (901) a resource to the modules (FIG. 1, 104). For example, the system manager (FIG. 3, 342) may transmit data to a module (FIG. 1, 104). Data may be transmitted on electrical or optical cables, among other types of data transmission cables. In one example, the system manager (FIG. 3, 342) supplies electrical power to the modules (FIG. 1, 104).

In some examples, the system manager (342) may receive (903) feedback relating to the resource. For example, the system manager (342) may receive an indication of the signal strength along a data transmission line. Based on the received feedback, the system manager (FIG. 3, 342) may manage (905) the module connectivity system. For example, the system manager (FIG. 3, 342) may generate an alert when the feedback detects a potential problem. In another example, the system manager (FIG. 3, 342) may alter the resource to resolve a potential problem.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor of a system manager (FIG. 3, 342) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a module connectivity device (FIG. 1, 100). The module connectivity device (FIG. 1, 100) comprises a stationary pivot plenum (FIG. 1, 101), a number of rocker-arm assemblies (FIG. 1, 102) movably coupled to the stationary pivot plenum (FIG. 1, 101), and a number of module connectors (FIG. 1, 103) movably coupled to the number of rocker-arm assemblies (FIG. 1, 102). A module connectivity system comprises a number of rocker-arm assemblies (FIG. 1, 102), and a number of module connectors (FIG. 1, 103). The module connectors (FIG. 1, 103) may be configured to mate to a connector (FIG. 2, 210) of a module (FIG. 1, 104). The system also comprises a system manager (FIG. 3, 342) to manage the connectivity of the module connectors (FIG. 1, 103).

The module connectivity device (FIG. 1, 100) may have a number of advantages, including: (1) installing and servicing system or switch modules on the same side as resource connections; (2) modular resource connections allow flexible cable (FIG. 1, 106) topologies (i.e., any number of rocker arms (FIG. 1, 102) and any number of module connectors (FIG. 1, 103) may be disposed in the module connectivity device (FIGS. 1, 100)); and (3) protection of small and low-cost optical and electrical fibers housed in a conduit of the rocker-arm assemblies (FIG. 1, 102) to reduce cost, reduce exposure, and makes better use of rack space.

The preceding description has been presented to illustrate and describe examples of the principles described. This description is not intended to be exhaustive or to limit these principles to any precise form disclosed. Many modifications and variations are possible in light of the above teaching.

What is claimed is:

1. A module connectivity device comprising:
 a stationary pivot plenum;
 a number of rocker-arm assemblies movably coupled to the stationary pivot plenum in which the rocker-arm assemblies move between an open position and a closed position;
 a gang bar to move the number of rocker-arm assemblies simultaneously, wherein the number of rocker-arm assemblies are removably coupled to the gang bar, wherein the number of rocker-arm assemblies are independently coupled to the gang bar; and
 a number of module connectors movably coupled to the number of rocker-arm assemblies, in which the module connectors move between a disengaged position and an engaged position.

2. The device of claim 1, wherein the rocker-arm assemblies comprise a number of interconnected arms to move the module connectors rotationally, laterally, or a combination thereof.

3. The device of claim 1, wherein the rocker-arm assemblies comprise a conduit to house optical waveguides, optical fibers, optical connectors, electrical cables, electrical connectors or a combination thereof.

4. The device of claim 1, further comprising:
 a retention mechanism to secure the rocker-arm assemblies in the open position, the closed position, or a combination thereof; and
 a connection mechanism to connect the module connectors to the module.

5. The device of claim 4, wherein the retention mechanism and connection mechanism are actuated by a single action.

6. The device of claim 4, wherein the retention mechanism and connection mechanism are actuated by multiple actions.

7. The device of claim 1, further comprising an indicator to indicate the connectivity state of the module connectors.

8. The device of claim 1, further comprising a request button to request the disconnection of a rocker-arm assembly.

9. The device of claim 1, further comprising a number of signal modification devices disposed in the rocker-arm assemblies.

10. A module connectivity system comprising:
 a number of rocker-arm assemblies;
 a number of module connectors movably coupled to the number of rocker-arm assemblies;
 a gang bar to move the number of rocker-arm assemblies simultaneously, wherein the number of rocker-arm assemblies are removably coupled to the gang bar, wherein the number of rocker-arm assemblies are independently coupled to the gang bar; and
 a module connectivity manager to manage the connectivity of the module connectors.

11. The system of claim 10, further comprising:
 a retention mechanism disposed on the module connectivity device, in which the retention mechanism interfaces with a rack to secure the module connectors in an engaged position, a disengaged position, or a combination thereof.

* * * * *